(12) United States Patent
Horng et al.

(10) Patent No.: US 7,463,108 B2
(45) Date of Patent: Dec. 9, 2008

(54) ACTIVE 90-DEGREE PHASE SHIFTER WITH LC-TYPE EMITTER DEGENERATION AND QUADRATURE MODULATOR IC USING THE SAME

(75) Inventors: Tzyy-Sheng Horng, Kaohsiung (TW); Jian-Ming Wu, Kaohsiung (TW); Fu-Yi Han, Kaohsiung (TW); Jenshan Lin, Gainesville, FL (US)

(73) Assignee: National Sun Yat-Sen University (TW)

( * ) Notice: Subject to any disclaimer, the term of this patent is extended or adjusted under 35 U.S.C. 154(b) by 81 days.

(21) Appl. No.: 11/524,874

(22) Filed: Sep. 22, 2006

(65) Prior Publication Data

US 2007/0241835 A1 Oct. 18, 2007

(51) Int. Cl.
*H04L 27/20* (2006.01)
(52) U.S. Cl. .................. 332/103; 327/231; 327/238; 327/246; 375/283; 375/330
(58) Field of Classification Search .............. 332/103; 327/231, 238, 246; 375/283, 330
See application file for complete search history.

(56) References Cited

U.S. PATENT DOCUMENTS 4,745,370 A * 5/1988 McGinn ................ 330/252
5,694,093 A 12/1997 DaSilva et al.

2004/0127172 A1* 7/2004 Gierkink et al. .............. 455/91

OTHER PUBLICATIONS

Werner Baumberger, "A Single-Chip Image Rejecting Receiver for the 2.44 GHz Band Using Commercial GaAs-MESFET-Technology," *IEEE Journal of Solid-State Circuits*, vol. 29, No. 10, Oct. 1994.
J.M. Wu, F.Y. Han, T.S. Horng, and J. Lin, "Direct-Conversion Quadrature Modulator MMIC Design with a New 90 Degrees Phase Shifter Including Package and PCB Effects for W-CDMA Applications," *35th European Microwave Conference—Paris*, 2005.

(Continued)

*Primary Examiner*—Robert Pascal
*Assistant Examiner*—Levi Gannon
(74) *Attorney, Agent, or Firm*—Venable LLP; Raymond J. Ho

(57) ABSTRACT

An active 90-degree phase shifter with LC-type emitter (source) degeneration is provided, which is practiced in an integrated circuit. The phase shifter comprises a first differential amplifier, having one first signal output end and comprising an inductor, a first transistor and a second transistor, wherein the inductor is connected to the emitters (sources) of the first and the second transistors; and a second differential amplifier, having one second signal output end and comprising a capacitor, a third transistor and a fourth transistor, wherein the capacitor is connected to the emitters (sources) of the third and the fourth transistors. Wherein the bases (gates) of the first and the fourth transistors are signal input ends, and the bases (gates) of the second and the third transistors are coupled together. Further, the phase shift between one signal input end and the first signal output end or the second signal output end is determined by the intrinsic resistors of the transistors, the inductor and the capacitor.

19 Claims, 4 Drawing Sheets

OTHER PUBLICATIONS

Farbod Behbahani, Yoji Kishigami, John Leete, and Asad A. Abidi, "CMOS Mixers and Polyphase Filters for Large Image Rejection," *IEEE Journal of Solid-State Circuits*, vol. 36, No. 6, Jun. 2001.

Marc Borremans, Michiel Steyaert and Takashi Yoshitomi, "A 1.5 V, Wide Band 3GHz, CMOS Quadrature Direct Up-Converter for Multi-Mode Wireless Communications," *IEEE 1998 Custom Integrated Circuits Conference*.

Hans-Martin Rein, Reinhard Reimann, Lothar Schmidt, "A 3Gb/s Bipolar Phase Shifter and AGC Amplifier," *1989 IEEE International Solid-State Circuits Conference*.

K.Maemura, Y.Kohno, H.Nakano, T.Shimura, K.Oki, H.Ishida and O.Ishihara, "The 200MHz-and 1.5GHz-Band GaAs Monolithic Quadrature Modulator ICs," *GaAs IC Symposium*.

Junji Itoh, Tadayoshi Nakatsuka, Kimihiko Sato, Yasumi Imagawa, Tomoya Uda, Takahiro Yokoyama, Masahiro Maeda and Osamu Ishikawa, "A Low Distortion GaAs Quadrature Modulator IC," *1998 IEEE Radio Frequency Integrated Circuits Symposium*.

M. Steyaert and R. Roovers, "A 1-GHz Single-Chip Quadrature Modulator," *IEEE Journal of Solid-State Circuits*, vol. 27, No. 8, Aug. 1992.

Kazuya Yamamoto, Kosei Maemura, Naoto Andoh, and Yasuo Mitsui, "A 1.9-GHz-Band GaAs Direct-Quadrature Modulator IC with a Phase Shifter," *IEEE Journal of Solid-State Circuits*, vol. 28, No. 10, Oct. 1993.

Robert V. Garver, "Broad-Band Diode Phase Shifters," *IEEE Transactions on Microwave Theory and Techniques*, vol. MTT-20, No. 5, May 1972.

Charles W. Suckling, Raymond S. Pengelly and John R. Cockrill, "Session XI: Monolithic Microwave Circuits," *1982 IEEE International Solid-State Circuits Conference*.

Stephen K. Altes, Tzu-Hung Chen, and Louis J. Ragonese, "Monolithic RC All-Pass Networks with Constant-Phase-Difference Outputs," *IEEE Transactions on Microwave Theory and Techniques*, vol. MTT-34, No. 12, Dec. 1986.

Angel Boveda, Felix Ortigoso, Jose I. Alonso, "A 0.7-3 GHz GaAs QPSK/QAM Direct Modulator," *IEEE Journal of Solid-State Circuits*, vol. 28, No. 12, Dec. 1993.

Hiroto Matsuoka and Tsuneo Tsukahara, "A 5-GHz Frequency-Doubling Quadreture Modulator with a Ring-Type Local Oscillator," *IEEE Journal of Solid-State Circuits*, vol. 34, No. 9, Sep. 1999.

* cited by examiner

ACTIVE 90-DEGREE PHASE SHIFTER WITH LC-TYPE EMITTER DEGENERATION AND QUADRATURE MODULATOR IC USING THE SAME

BACKGROUND OF THE INVENTION

1. Field of the Invention

The present invention relates to a design method for a phase shifter, especially to a 90-degree phase shifter used by a quadrature modulator integrated circuit. The present invention implements a design method for a 90-degree phase shifter required by a quadrature modulator integrated circuit by using a RL-RC type microwave network formed by the intrinsic resistors of the transistors of differential amplifiers combined with emitter (source)-degenerative inductor and capacitor.

2. Description of the Related Art

The performance of a quadrature modulator is relative to the precision of the 90-degree phase shift as well as the low amplitude disharmony of the signal from the local oscillator. Many methods for implementing 90-degree phase shift have been suggested now, such as frequency doubling (for example, see H. M. Rein, R. Reimann, and L. Schmidt, "A 3 Gb/s bipolar phase shifter and AGC amplifier," in IEEE Int. Solid-State Circuits Conf. Tech. Dig., 1989, pp. 144-145.; K. Maemura, Y. Kohno, H. Nakano, T. Shimura, K. Oki, H. Ishida, and O. Ishihara, "The 200 MHz- and 1.5 GHz-band GaAs monolithic quadrature modulator ICs," in Gallium Arsenide Integrated Circuit Symp. Dig., 1990, pp. 283-286.; J. Itoh, T. Nakatsuka, K. Sato, Y. Imagawa, T. Uda, T. Yokoyama, M. Maeda, and O. Ishikawa, "A low distortion GaAs quadrature modulator IC," in IEEE Radio-Frequency Integrated Circuit Symp. Dig., 1998, pp. 55-58). The use of frequency doubling is advantageous to the precise control of the phase shift, however the current consumption is higher. Another method is the use of RC integrator/CR differentiator (for example, see M. Steyaert, and R. Roovers, "A 1-GHz single-chip quadrature modulator," IEEE J. Solid-State Circuits, vol. 27, pp. 1194-1197, August 1992.; K. Yamamoto, K. Maemura, N. Andoh, and Y. Mitsui, "A 1.9-GHz-band GaAs direct-quadrature modulator IC with a phase shifter," IEEE J. Solid-State Circuits, vol. 28, pp. 994-1000, October 1993.; U.S. Pat. No. 5,694,093 entitled "Wideband IQ modulator with RC/CR automatic quadrature network"). The use of RC integrator/CR differentiator is advantageous to the simple design as well as small current consumption, however the implementation loss is higher.

In addition to the above two methods, LC high pass/low pass filter method, RC full pass filter method, ring oscillator method, multi-phase filter method, etc. can also be used, however they still have the disadvantages of high implementation loss, difficult to be integrated in an integrated circuit, complex design, the difficulty of precise control of the phase shift, high current consumption, etc.

In summary, the common disadvantage for the above design methods is high implementation loss, it is because resistors used by existing 90-degree phase shifters are real resistors.

SUMMARY OF THE INVENTION

It is one object of the present invention to provide a novel design method for a 90-degree phase shifter required by a quadrature modulator integrated circuit by using a RL-RC type microwave network formed by the intrinsic resistors of the transistors of differential amplifiers combined with emitter (source)-degenerative inductor and capacitor.

The present invention is different form other existing 90-degree phase shifters in that resistors used by existing 90-degree phase shifters are real resistors. Because the 90-degree phase shifter of the present invention dose not use real resistors as constituting elements, thereby it has the advantage of low implementation loss, such that the required carrier wave power of the local oscillating source can be effectively decreased in order to reduce the leakage amount of the carrier wave.

The present invention provides an active 90-degree phase shifter with LC-type emitter (source) degeneration, which is practiced in an integrated circuit. The phase shifter comprises a first differential amplifier, having one first signal output end and comprising an inductor, a first transistor and a second transistor, wherein the inductor is connected to the emitters (sources) of the first and the second transistors; and a second differential amplifier, having one second signal output end and comprising a capacitor, a third transistor and a fourth transistor, wherein the capacitor is connected to the emitters (sources) of the third and the fourth transistors. Wherein the bases (gates) of the first and the fourth transistors are signal input ends, and the bases (gates) of the second and the third transistors are coupled together. Further, the phase shift between one signal input end and the first signal output end or the second signal output end is determined by the intrinsic resistors of the transistors, the inductor and the capacitor.

Further, the present invention provides a quadrature modulator integrated circuit, comprising an active 90-degree phase shifter having an input end and plural output ends; and doubly balanced wave mixers coupled to the output ends, characterized in that the active 90-degree phase shifter is formed by a first differential amplifier and a second differential amplifier, the first differential amplifier comprises a first transistor and a second transistor and uses an inductor as the emitter (source)-degenerative element, the second differential amplifier comprises a third transistor and a fourth transistor and uses a capacitor as the emitter (source)-degenerative element, further, the phase shift between one signal input end and the first signal output end or the second signal output end is determined by the intrinsic resistors of the transistors, the inductor and the capacitor.

The above purposes and features of the present invention will be described in detail with reference to accompanying drawings. However, it should be understood the accompanying drawings and examples are explanatory only and are not restrictive of the invention.

DETAILED DESCRIPTION OF THE PREFERRED EMBODIMENTS

Although the present invention will be described in considerable detail with reference to accompanying figures containing preferred embodiments thereof, however prior to this description, it should be understood that those skilled in the art can easily make changes to the present invention described herein and the same performance as the present invention is obtained. Therefore, it is to be understood that the following description is a general disclosure to those skilled in the art and is not restrictive of the present invention.

Figure 2:
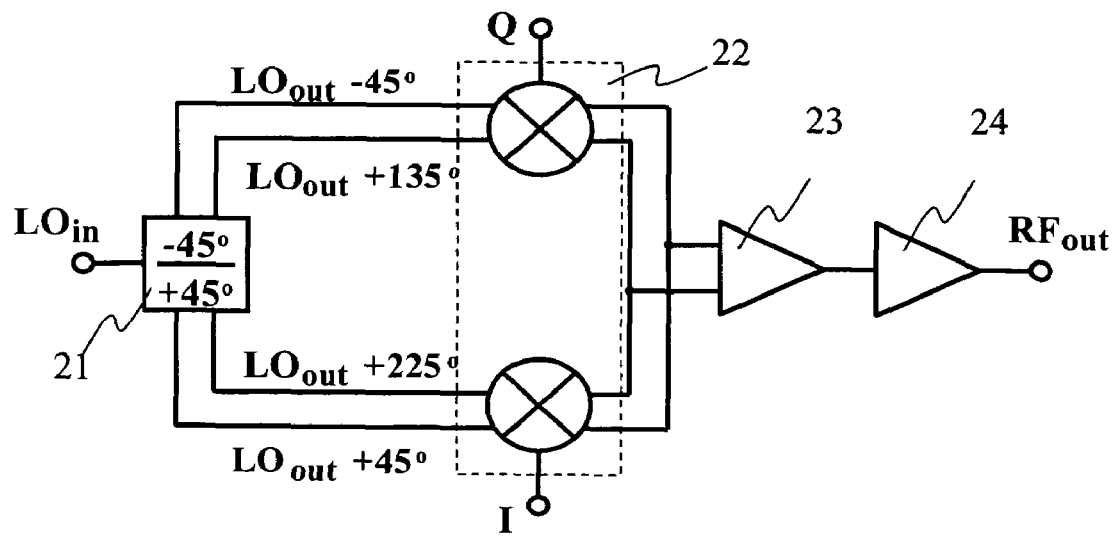
FIG. 2 is a structural view of a quadrature modulator integrated circuit using the novel 90-degree phase shifter of the present invention.

Referring to FIG. 2, a structural view of a quadrature modulator integrated circuit of the present invention is shown. This quadrature modulator is consisted of a novel 90-degree phase shifter 21, two doubly balanced wave mixers 22, one differential single-ended converter 23 and one output buffer 24. The 90-degree phase shifter 21 generates the phase shift showed in FIG. 2, wherein $LO_{out}-45°$ has a delaying phase of 45-degree compared with LOin, $LO_{out}+135°$ has a leading phase of 135-degree compared with LOin, $LO_{out}+225°$ has a leading phase of 225-degree compared with LOin and $LO_{out}+45°$ has a leading phase of 45-degree compared with LOin. Quadrature modulation is performed by two doubly balanced wave mixers 22. The differential single-ended converter 23 is in a totem-pole configuration and takes differential charges from mixer 22 to transform as single-ended output. The output buffer 24 is designed with output impedance matched to 50 Ω for the purpose of amplification.

Figure 1:
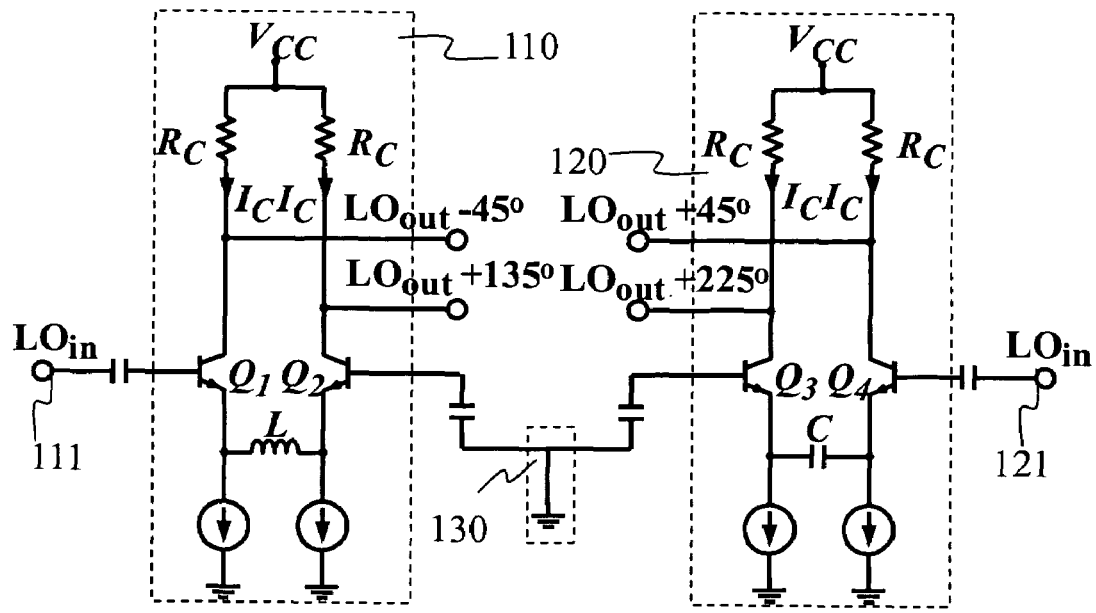
FIG. 1 is a design method for a novel 90-degree phase shifter of the present invention.

Referring to FIG. 1, a design method for a 90-degree phase shifter used by the quadrature modulator integrated circuit of the present invention is shown. This 90-degree phase shifter is consisted of two differential amplifiers, the emitter (source) of one differential amplifier 110 is connected to an inductor L which is an emitter (source)-degenerative element and the emitter (source) of the other differential amplifier 120 is connected to a capacitor C which is an emitter (source)-degenerative element. Each differential amplifier has two input ends, one is the input end 111, 121 for a local oscillating signal, and the other one is an AC ground 130. Each differential amplifier has two local oscillating signal output ends, wherein the phase shift between output and input ends showed in FIG. 1. The 90-degree phase shift is mainly determined by intrinsic resistors of transistors Q1, Q2, Q3, Q4 and the emitter (source)-degenerative inductor L and capacitor C.

Figure 3A:
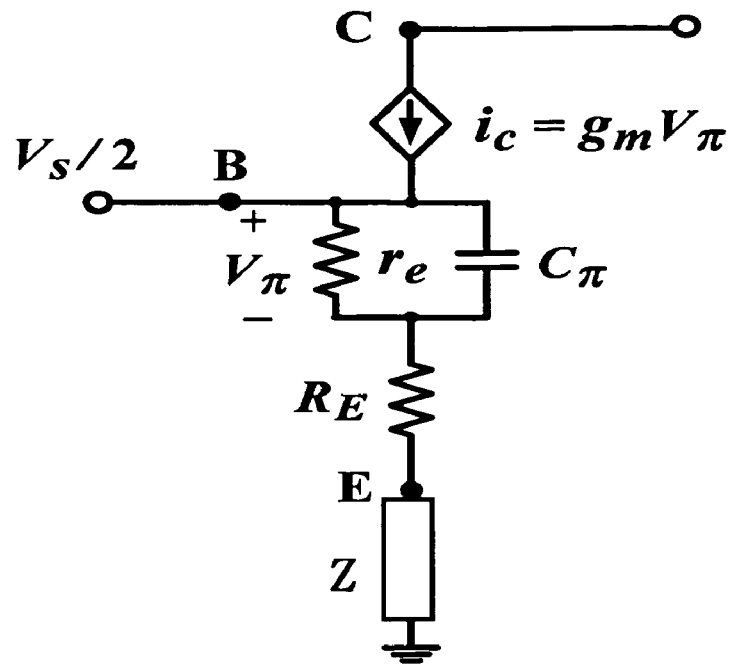
FIG. 3A is a small signal T-model differential half circuit of the 90-degree phase shifter.

Referring to FIG. 3A, a small signal T-model differential half circuit of the 90-degree phase shifter of the present invention is shown. The impedance (Z) of the emitter (source)-degenerative element in this model equals to $jΩL/2$ or $1/(j2ΩC)$, wherein $V_s$ and $V_π$ respectively indicate the signal source voltage and the base-emitter voltage, $r_e$ indicates the emitter resistor, $C_π$ indicates the base-emitter junction capacitor formed by the diffusion capacitor and the depletion capacitor, $R_E$ indicates the emitter parasitical resistor, and $g_m$ indicates the trans-conductance of the transistor. When the collector is AC grounded, the trans-conductance gain of the differential half circuit can be derived from the following equation, $$G(\omega) = \frac{i_c}{g_m V_s} = \frac{V_\pi}{V_s} = \frac{r_e/2}{(r_e + R_E + j\omega C_\pi r_e R_E) + (1 + j\omega C_\pi r_e)Z} \quad (1)$$

With the above equation (1), the amplitude error ($A_e$) and the phase shift error ($\theta_e$) can be defined as the following equations:

$$A_e(\omega) = \left| \frac{G(\omega)|_{Z=j\omega L/2}}{G(\omega)|_{Z=1/(j2\omega C)}} \right| \quad (2)$$

$$\theta_e(\omega) = \angle \frac{G(\omega)|_{Z=j\omega L/2}}{G(\omega)|_{Z=1/(j2\omega C)}} + \frac{\pi}{2} \quad (3)$$

In fact, the L and C are selected to meet the conditions of $C_π r_e R_E \ll L/2 \ll (r_e+R_E)/(2\omega C_π r_e)$ and $C_π \ll 2C \ll 1/(2\Omega C_π r_e R_E)$, such that equations (2) and (3) can be simplified as $$A_e(\omega) \approx \left| \frac{2(r_e + R_E) - j/(\omega C)}{2(r_e + R_E) + j\omega L} \right| \quad (4)$$

$$\theta_e(\omega) \approx \tan^{-1}[2(r_e + R_E)\omega C] - \tan^{-1}\left[\frac{\omega L}{2(r_e + R_E)}\right] \quad (5)$$

Analyzing equations (4) and (5), when $$\omega = \frac{1}{\sqrt{LC}} \quad (6)$$

$$(r_e + R_E) = \frac{1}{2}\sqrt{\frac{L}{C}} \quad (7)$$

$A_e$ and $\theta_e$ in equations (4) and (5) both equals to zero, that is the desirable 90-degree phase shifter is implemented. When equations (6) and (7) are met, the differential amplifier having the emitter (source)-degenerative inductor will provide a 45-degree lagged phase shift, and the differential amplifier having the emitter (source)-degenerative capacitor will provide a 45-degree advanced phase shift.

When the quadrature modulator integrated circuit having the novel 90-degree phase shifter design is applied to a W-CDMA system, it is analyzed and found that when the carrier wave power of the local oscillating source is −20 dBm, then the 90-degree phase difference can be implemented by a loss of about 3 dB. Compare with existing 90-degree phase shifters, the present invention has a minimum implementation loss.

Figure 3B:
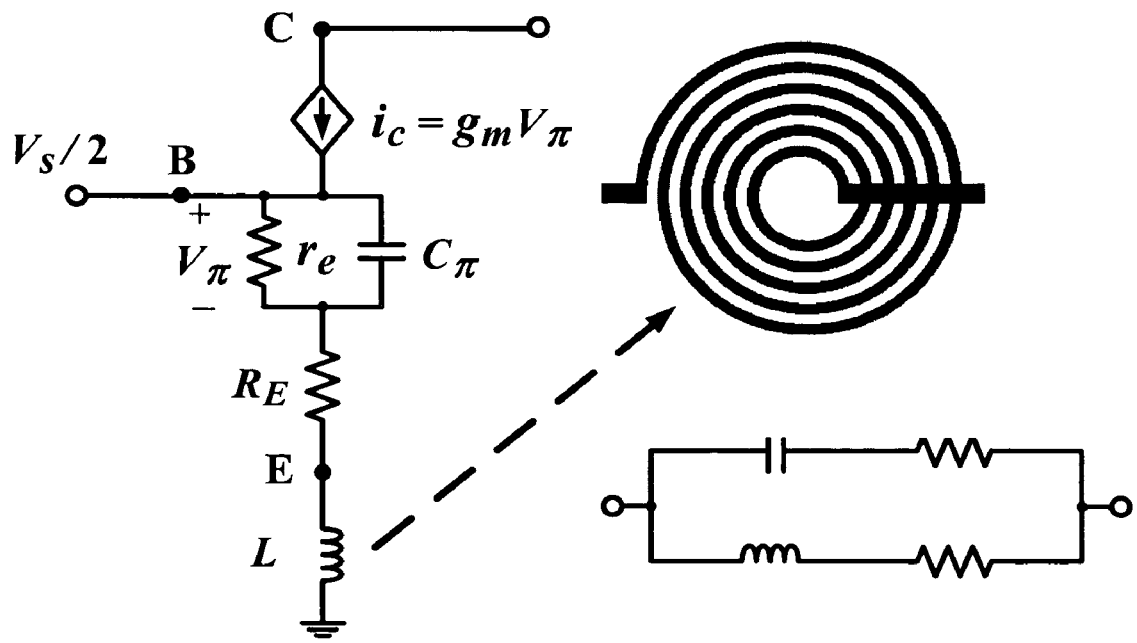
FIG. 3B is an equivalent circuit model of a coil inductor.

Referring to FIG. 3B, an equivalent circuit model of a coil inductor is shown. Because the parasitical capacitor and loss of a coil inductor is unnegligible, in the design of a 90-degree phase shifter, the equivalent circuit model of a coil inductor must be carefully considered in order to reduce the error.

Figure 4:
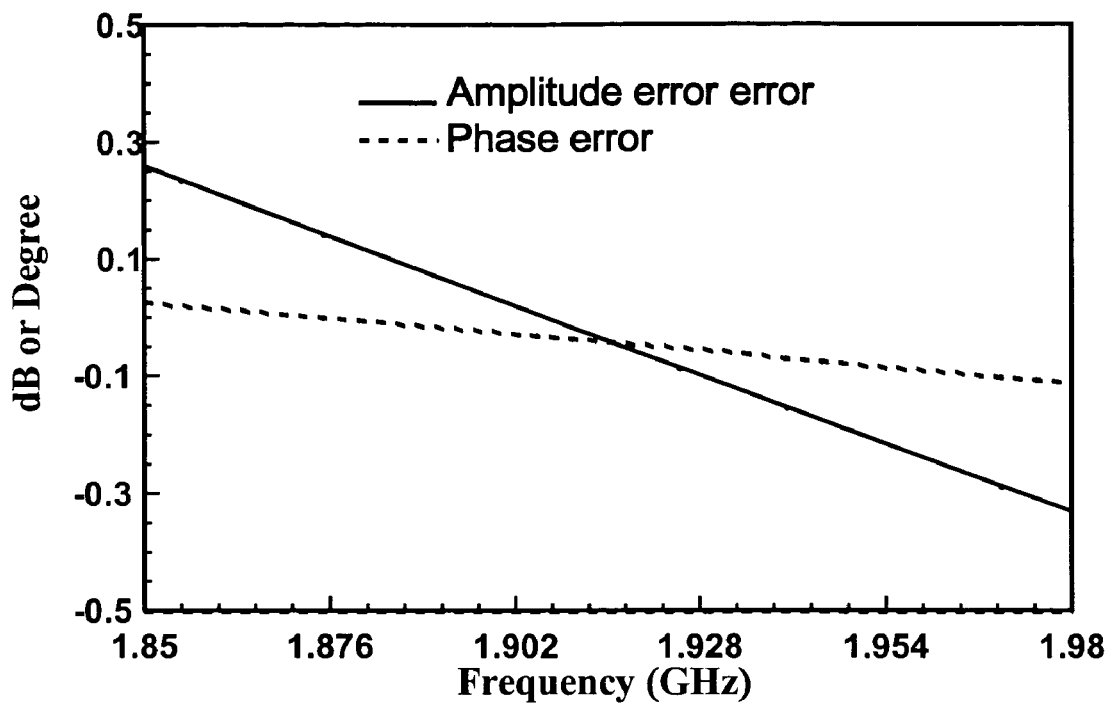
FIG. 4 shows the amplitude error and the phase error of the 90-degree phase shifter of the present invention.

Referring to FIG. 4, it is shown that the amplitude error and the phase error of the 90-degree phase shifter of the present invention in the illustrated frequency range are respectively 0.3~−0.4 dB and 0.04~−0.12 degree. The illustrated frequency range is covered by the I band and II band of the W-CDMA.

Figure 5:
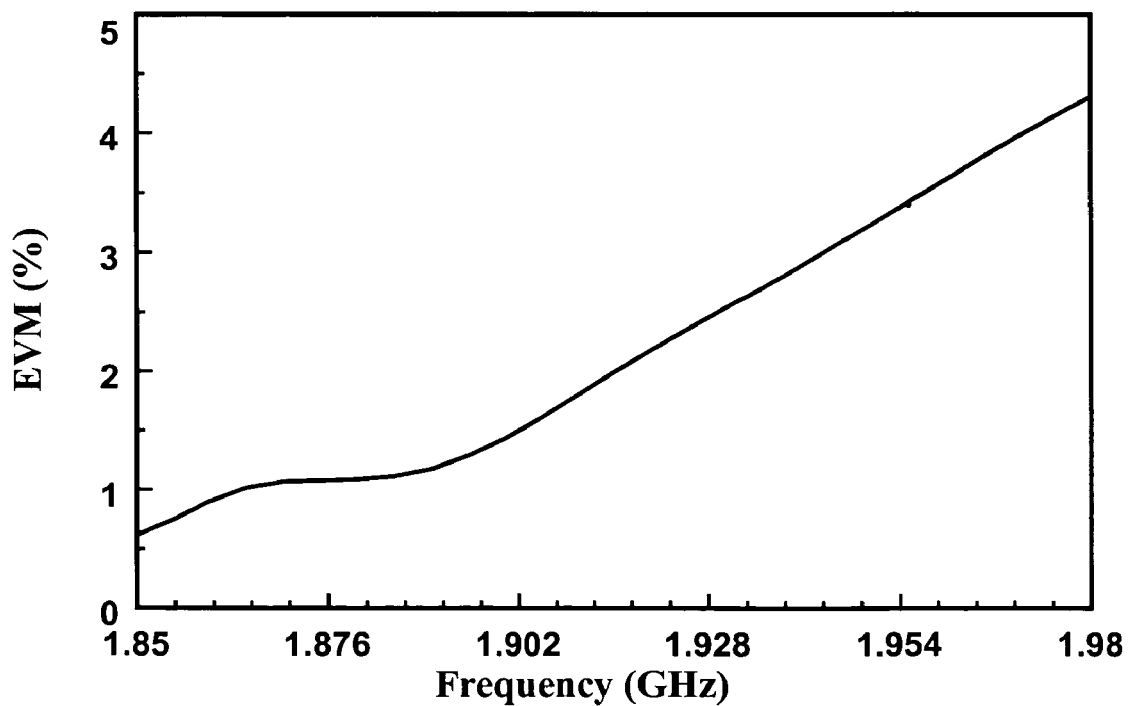
FIG. 5 shows the error vector magnitude of the quadrature modulator integrated circuit of the present invention.

Referring to FIG. 5, it is shown that a W-CDMA signal having an output power of −5 dBm and a modulated width of 5 MHz modulated by the quadrature modulator integrated circuit of the present invention has an error vector magnitude (EVM) of 0.5~4.5% in this frequency range. After analysis, the amplitude error is the major contribution to the error vector magnitude, and the amplitude error is mainly caused by the unnegligible parasitical capacitor and loss of the coil inductor used as the emitter (source)-degenerative element of a differential amplifier. As shown in FIG. 3B, if the equivalent circuit model of a coil inductor can be carefully considered in the design of a 90-degree phase shifter, then the amplitude error will be greatly reduced.

Figure 6:
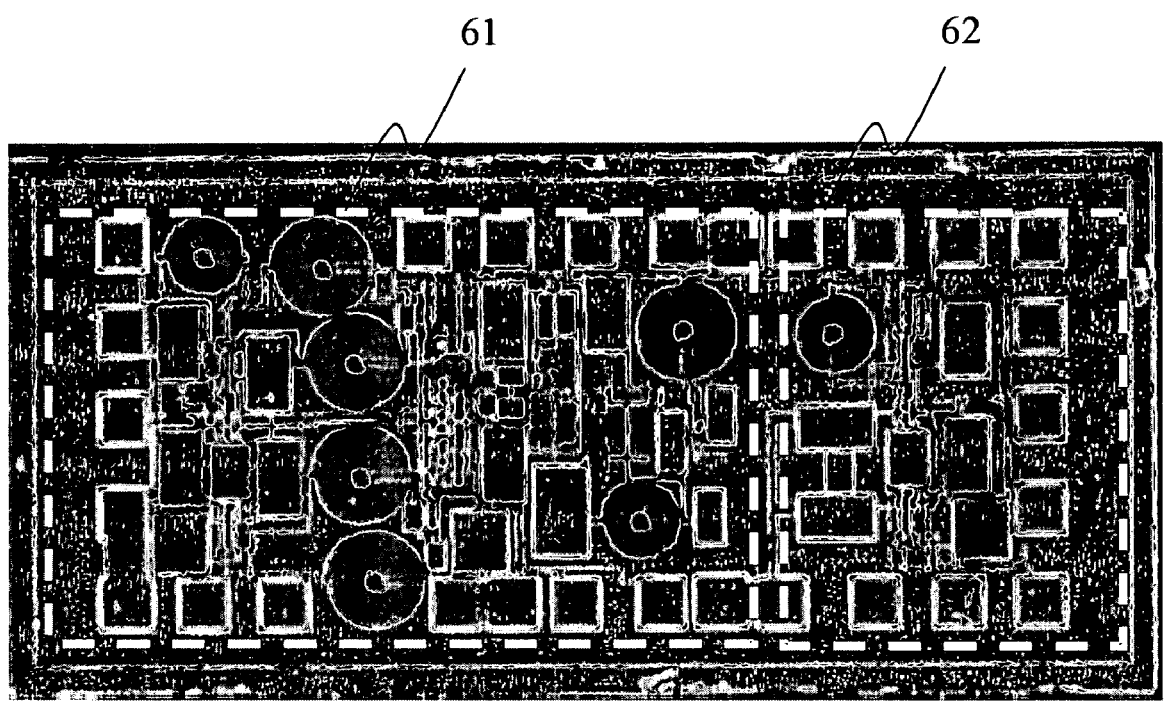
FIG. 6 is an embodiment of the quadrature modulator integrated circuit of the present invention.

Referring to FIG. 6, an embodiment of the quadrature modulator integrated circuit of the present invention based on the above requirement is shown. The quadrature modulator integrated circuit is formed by a quadrature modulator 61 and a 90-degree phase shifter 62 and is manufactured by the GaAs extrinsic junction bipolar transistor process.

In application, when the present invention is applied to a quadrature modulator integrated circuit having a radio frequency microwave band in a communication system, it is advantageous for the low implementation loss of the 90-degree phase shifter and therefore the low carrier wave power of the local oscillating source, such that various standards regarding magnetic interference can easily be met and an accurate modulated digital signal can be provided. Therefore, the present invention can be applied to transmitters in various digital communication system.

Although the present invention has been described in considerable detail with reference to certain preferred embodiments thereof, those skilled in the art can easily understand that all kinds of alterations and changes can be made within the spirit and scope of the appended claims. Therefore, the spirit and scope of the appended claims should not be limited to the description of the preferred embodiments contained herein.

What is claimed is:

1. An active 90-degree phase shifter with LC-type emitter (source) degeneration, which is practiced in an integrated circuit, comprising:
    a first differential amplifier, having one first signal output end and comprising an inductor, a first transistor and a second transistor, said inductor is connected to the emitters (sources) of said first and said second transistors; and
    a second differential amplifier, having one second signal output end and comprising a capacitor, a third transistor and a fourth transistor, said capacitor is connected to the emitters (sources) of said third and said fourth transistors,
    wherein the bases (gates) of said first and said fourth transistors are signal input ends used for receiving local oscillating signals, and the bases (gates) of said second and said third transistors are coupled together to be AC grounded,
    wherein the phase shift between said one signal input end and said first signal output end or said second signal output end is determined by the intrinsic resistors of said transistors, said inductor and said capacitor.

2. The active 90-degree phase shifter with LC-type emitter (source) degeneration as claimed in claim 1, wherein said intrinsic resistors are emitter resistors and emitter parasitical resistors.

3. The active 90-degree phase shifter with LC-type emitter (source) degeneration as claimed in claim 2, wherein the impedance of said inductor and capacitor is determined by an angular frequency, when said angular frequency is equal to the reciprocal of the root of the product of the inductance of said inductor and the capacitance of said capacitor and the intrinsic resistances of said transistors are equal to one half of the root of the value of dividing said inductance by said capacitance, and then the phase shift between said signal input end and said first signal output end is −45 degrees or +135 degrees.

4. The active 90-degree phase shifter with LC-type emitter (source) degeneration as claimed in claim 2, wherein the impedance of said inductor and capacitor is determined by an angular frequency, when said angular frequency is equal to the reciprocal of the root of the product of the inductance of said inductor and the capacitance of said capacitor and the intrinsic resistances of said transistors are equal to one half of the root of the value of dividing said inductance by said capacitance, and then the phase shift between said signal input end and said second signal output end is +45 degrees or +225 degrees.

5. The active 90-degree phase shifter with LC-type emitter (source) degeneration as claimed in claim 1, wherein the impedance of said inductor and capacitor is determined by an angular frequency, when said angular frequency is equal to the reciprocal of the root of the product of the inductance of said inductor and the capacitance of said capacitor and the intrinsic resistances of said transistors are equal to one half of the root of the value of dividing said inductance by said capacitance, and then the phase shift between said signal input end and said first signal output end is '45 degrees or +135 degrees.

6. The active 90-degree phase shifter with LC-type emitter (source) degeneration as claimed in claim 1, wherein the impedance of said inductor and capacitor is determined by an angular frequency, when said angular frequency is equal to the reciprocal of the root of the product of the inductance of said inductor and the capacitance of said capacitor and the intrinsic resistances of said transistors are equal to one half of the root of the value of dividing said inductance by said capacitance, and then the phase shift between said signal input end and said second signal output end is +45 degrees or +225 degrees.

7. The active 90-degree phase shifter with LC-type emitter (source) degeneration as claimed in claim 1, wherein said integrated circuit is a quadrature modulator comprising an active 90-degree phase shifter with LC-type emitter (source) degeneration, doubly balanced wave mixers, a differential single-ended converter and an output buffer.

8. The active 90-degree phase shifter with LC-type emitter (source) degeneration as claimed in claim 1, wherein said transistors are bipolar junction transistors or field effect transistors.

9. The active 90-degree phase shifter with LC-type emitter (source) degeneration as claimed in claim 1, wherein said inductor is implemented with a coil inductor.

10. A quadrature modulator integrated circuit, comprising an active 90-degree phase shifter having an input end and plural output ends and doubly balanced wave mixers coupled to said output ends, characterized in that:
    said active 90-degree phase shifter is formed by a first differential amplifier and a second differential amplifier, said first differential amplifier comprises a first transistor and a second transistor and uses an inductor as the emitter (source)-degenerative element, said second differential amplifier comprises a third transistor and a fourth transistor and uses a capacitor as the emitter (source)-degenerative element, the bases (gates) of said first and said fourth transistors are signal input ends used for receiving local oscillating signals, and the bases (gates) of said second and said third transistors are coupled together to be AC grounded further, the phase shift between said signal input end and said first signal output end or said second signal output end is determined by the intrinsic resistors of said transistors, said inductor and said capacitor.

11. The quadrature modulator integrated circuit as claimed in claim 10, further comprising a differential single-ended converter and an output buffer.

12. The quadrature modulator integrated circuit as claimed in claim 10, wherein said quadrature modular integrated circuit is manufactured by the GaAs extrinsic junction bipolar transistor process.

13. The quadrature modulator integrated circuit as claimed in claim 10, wherein said transistors are bipolar junction transistors or field effect transistors.

14. The quadrature modulator integrated circuit as claimed in claim 10, wherein said intrinsic resistors are emitter resistors and emitter parasitical resistors.

15. The quadrature modulator integrated circuit as claimed in claim 14, wherein the impedance of said inductor and capacitor is determined by an angular frequency, when said angular frequency is equal to the reciprocal of the root of the product of the inductance of said inductor and the capacitance of said capacitor and the intrinsic resistances of said transistors are equal to one half of the root of the value of dividing said inductance by said capacitance, and then the phase shift between said signal input end and said first signal output end is −45 degrees or +135 degrees.

16. The quadrature modulator integrated circuit as claimed in claim 14, wherein the impedance of said inductor and capacitor is determined by an angular frequency, when said angular frequency is equal to the reciprocal of the root of the product of the inductance of said inductor and the capacitance of said capacitor and the intrinsic resistances of said transistors are equal to one half of the root of the value of dividing said inductance by said capacitance, and then the phase shift between said signal input end and said second signal output end is +45 degrees or +225 degrees.

17. The quadrature modulator integrated circuit as claimed in claim 10, wherein the impedance of said inductor and capacitor is determined by an angular frequency, when said angular frequency is equal to the reciprocal of the root of the product of the inductance of said inductor and the capacitance of said capacitor and the intrinsic resistances of said transistors are equal to one half of the root of the value of dividing said inductance by said capacitance, and then the phase shift between said signal input end and said first signal output end is −45 degrees or +135 degrees.

18. The quadrature modulator integrated circuit as claimed in claim 10, wherein the impedance of said inductor and capacitor is determined by an angular frequency, when said angular frequency is equal to the reciprocal of the root of the product of the inductance of said inductor and the capacitance of said capacitor and the intrinsic resistances of said transistors are equal to one half of the root of the value of dividing said inductance by said capacitance, and then the phase shift between said signal input end and said second signal output end is +45 degrees or +225 degrees.

19. The quadrature modulator integrated circuit as claimed in claim 10, wherein said inductor is implemented with a coil inductor.

* * * * *